United States Patent [19]
Szapucki et al.

[11] Patent Number: 5,657,975
[45] Date of Patent: Aug. 19, 1997

[54] CLIP HEAD APPARATUS FOR RETAINING A SEMICONDUCTOR WAFER ON A PEDESTAL

[76] Inventors: Matthew Peter Szapucki, 1282 W. Todd Rd., Toms River, N.J. 08755; Richard Kulkaski, 1210 Gannet Ct., Forked River, N.J. 08731

[21] Appl. No.: 467,981

[22] Filed: Jun. 6, 1995

Related U.S. Application Data

[63] Continuation-in-part of Ser. No. 218,344, Mar. 25, 1995, Pat. No. 5,458,322.

[51] Int. Cl.⁶ ........................................ B25B 1/00
[52] U.S. Cl. ................ 269/254 R; 269/157; 269/265
[58] Field of Search .................. 269/254 R, 152, 269/153, 155, 268, 217, 157, 234, 138, 134, 265

[56] References Cited

U.S. PATENT DOCUMENTS

| | | |
|---|---|---|
| 4,306,731 | 12/1981 | Shaw . |
| 4,643,409 | 2/1987 | Hamatani ................ 269/254 R |
| 4,911,597 | 3/1990 | Maydan et al. . |
| 4,915,367 | 4/1990 | Carossino . |
| 4,995,063 | 2/1991 | Enoki et al. . |
| 5,040,484 | 8/1991 | Mears et al. . |
| 5,083,364 | 1/1992 | Olbrich et al. . |
| 5,116,181 | 5/1992 | Severns et al. . |
| 5,183,245 | 2/1993 | DiNapoli et al. . |
| 5,224,809 | 7/1993 | Maydan et al. . |
| 5,253,411 | 10/1993 | DiNapoli et al. . |
| 5,280,983 | 1/1994 | Maydan et al. . |

Primary Examiner—Robert C. Watson
Attorney, Agent, or Firm—Watov & Kipnes, P.C.

[57] ABSTRACT

A clip assembly for retaining a semiconductor wafer on a pedestal during processing of the wafer, and releasing the wafer for removal from the pedestal after processing, includes a pair of tines each having a lower sloping surface for contacting an edge of an associated semiconductor wafer, and a ledge provided immediately above the lower sloping surface inward from a shared leading edge serves to catch debris or particulate material, preventing it from falling onto the surface of the semiconductor wafer. A metal spring, biasing the clip head into contact with the wafer, has an upper portion molded into the electrically non-conductive material of the clip head behind a front face thereof, whereby the spring and clip head form a monolithic assembly.

17 Claims, 4 Drawing Sheets

CLIP HEAD APPARATUS FOR RETAINING A SEMICONDUCTOR WAFER ON A PEDESTAL

RELATED APPLICATION

This application is a continuation-in-part application of application Ser. No. 08/218,344, entitled "Debris Trapping/Anti-Arc Clip For Retaining A Semiconductor Wafer On A Pedestal", filed on Mar. 25, 1995, now U.S. Pat. No. 5,458,322 and conceived by the same inventors hereof. The teachings of the related application are incorporated herein by reference to the extent they do not conflict herewith.

BACKGROUND OF THE INVENTION

1. Field of the Invention

The present invention relates generally to apparatus for manufacturing semiconductors, such as integrated circuits obtained by processing silicon wafers, and more particular relates to clips for retaining a semiconductor wafer on a pedestal of associated semiconductor processing apparatus.

2. Discussion of Related Art

Semiconductor conductor wafer processing equipment typically include one or more pedestals, that are generally vertically oriented, upon which semiconductor wafers are secured via specially designed clips to the pedestals. The clips are generally arranged around the circumference of the pedestal, in sufficient number, for securing a semiconductor wafer to the pedestal in such a manner that the clips can be operated to a position out of engagement with the edges or outer circumference of the associated wafer, for either permitting its installation or removal from the pedestal, and to another operative position for contacting typically the top edge of the wafer for safely securing the wafer to the pedestal without chipping or otherwise damaging the semiconductor wafer.

DiNapoli, et al. U.S. Pat. No. 5,183,245 (hereinafter DiNapoli), entitled "SEMI-CONDUCTOR WAFER RETENTION CLIP", shows and describes both a prior art clip (see FIG. 6 hereof), and an improvement to the securement head 91 of the prior clip, in a clip design as shown in FIG. 4 thereof (see FIG. 1 hereof). Although the present inventors believe that DiNapoli shows an improvement relative to prior clips thereto for reducing the amount of contamination to associated semiconductor wafers caused by the retention clips, the contamination problem still persists. Also, its Applicants' understanding that the improved clip design of DiNapoli, while reducing such contamination problems, increased electrical or plasma arcing problems that tend to reduce the yield of semiconductors devices from the semiconductor wafer being processed.

As taught in DiNapoli, the clip heads of the semiconductor wafer retention clips are formed of Lexan® material, a plastic material. A metal spring is used to spring bias the pedestal clip, and retain the same to a metal base member. Metal screws are used to secure the spring to the clip head thereof. During processing of the associate semiconductor wafer, plasma etching is typically used. Unfortunately, in addition to etching away selected portions of the semiconductor wafer, the plasma also causes etching or decomposition of the plastic material of the plastic clip head of the semiconductor wafer retention clip. Although the improved semiconductor wafer retention clip of DiNapoli eliminated a portion of the plastic material of the clip head, plasma etching of the remaining clip head still occurs, and results in disintegration of the plastic material of the clip head that still presents a contamination problem when some of the material removed from the clip head by the plasma falls onto the surface of the associated semiconductor wafer. This typically occurs at certain times when the clip head moves between positions for retaining the wafer and positions for not engaging the wafer. Another problem that still persists is that the chemical plasma used in the plasma etching process is generated with high voltage radio frequency or energy or electromagnetic fields, typically attaining voltage levels in the range of 2000 volts. The high energy plasma at times causes voltage arcing to surfaces such as presented by the metal screws attached to the metal spring used in the clips.

The present inventors recognize that although the semiconductor wafer retention clip improved design shown in DiNapoli does apparently reduce contamination of the semiconductor wafer from plastic material etched away from the plastic clip, the contamination problem was not eliminated, and continues to reduce the yield of semiconductor integrated circuits, and so forth, obtainable from associated semiconductor wafers after processing. Also, the previously mentioned arcing problem, when it occurs, substantially reduces the yield.

SUMMARY OF THE INVENTION

With the problems of the prior art in mind, an object of the present invention is to provide an improved clip for retaining semiconductor wafers on a pedestal during processing of the wafers.

Another object of the invention is provide such a clip with the capability of reducing the amount of debris associated with the clip from falling onto the surface of an associated semiconductor wafer during processing.

Another object of the invention is to substantially reduce high voltage arcing between the highly charged plasma material and metal surfaces of the clip exposed to the plasma.

In one embodiment of the invention, the clip for retaining semiconductor wafers on a pedestal includes a spring biased head portion including a rearmost tab for receiving a tool that presses upon the tab for overcoming the spring biased to pull the clip head away from an associated semiconductor wafer, and further including a pair of spaced apart projecting tines having a slanted under surface for contacting a top edge portion of an associated semiconductor wafer, respectively, with each of the tines further including shelf means above a lower sloping wafer contact face, for trapping and holding debris that might otherwise fall to the surface of the semiconductor wafer during movement of the head of the clip either away from or towards the associated semiconductor wafer, or even while the clip head is at rest. In another embodiment of the invention, to substantially prevent arcing between the plasma and the clip head, a required stainless steel spring is positioned within a mold cavity during the process of injection molding a clip head, for providing the spring and clip head as a monolithic assembly, with the spring being surrounded at its upper portions by the electrically insulative material of the clip head. In this manner, portions of the spring typically exposed to the plasma are isolated therefrom, preventing electrical arcing therebetween, and the spring is secured to the clip head.

BRIEF DESCRIPTION OF THE DRAWINGS

Various embodiments of the present invention are described in detail below with reference to the drawings in which like items are indicated by the same reference designation, wherein.

DETAILED DESCRIPTION OF THE INVENTION

Figure 1:
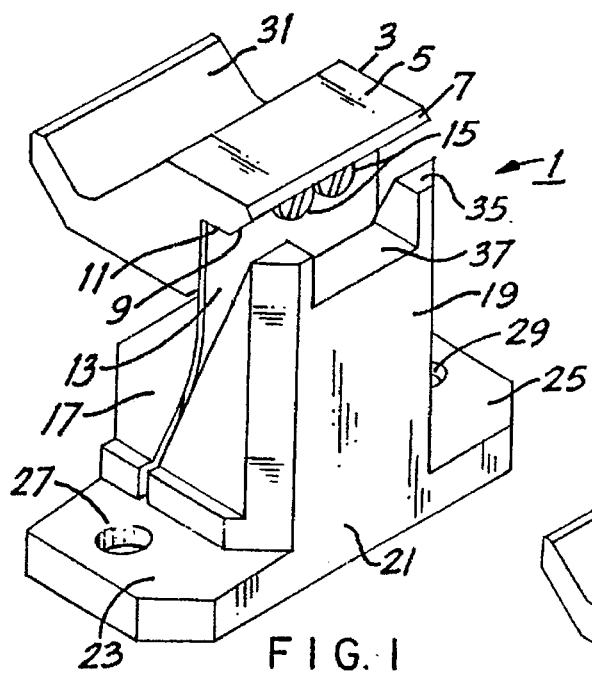
FIG. 1 is a perspective view of a prior art clip for retaining semiconductor wafers on a pedestal.
Figure 2:
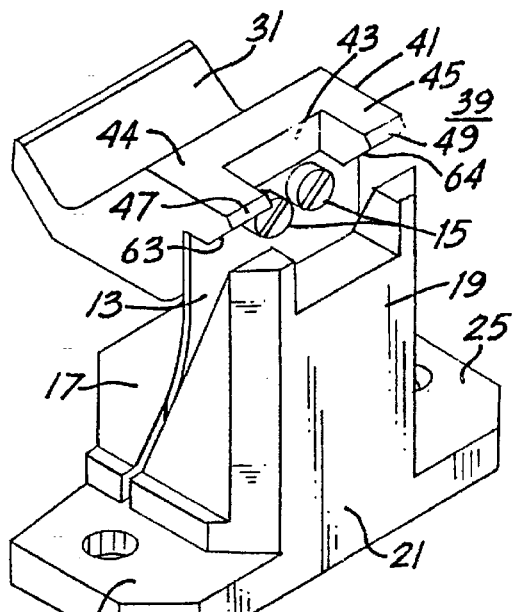
FIG. 2 is a perspective view of a prior art clip for retaining semiconductor wafers on a pedestal.
Figure 4:
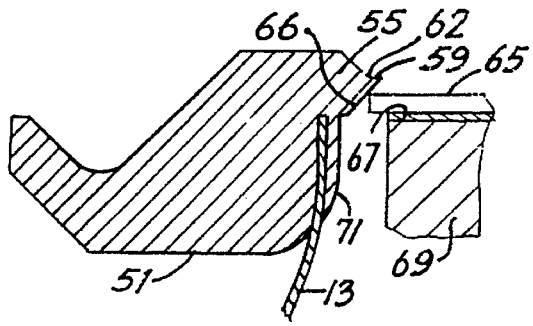
FIG. 4 is a partial cross-sectional view taken along 4—4 of FIG. 3, and partial side view of the clip head of FIG. 3 of the present invention in contact with a semiconductor wafer.
Figure 5:
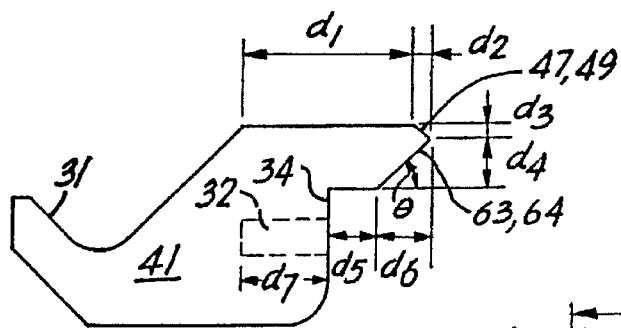
FIG. 5 is a side elevational view of the prior art clip head of FIG. 2.
Figure 6:
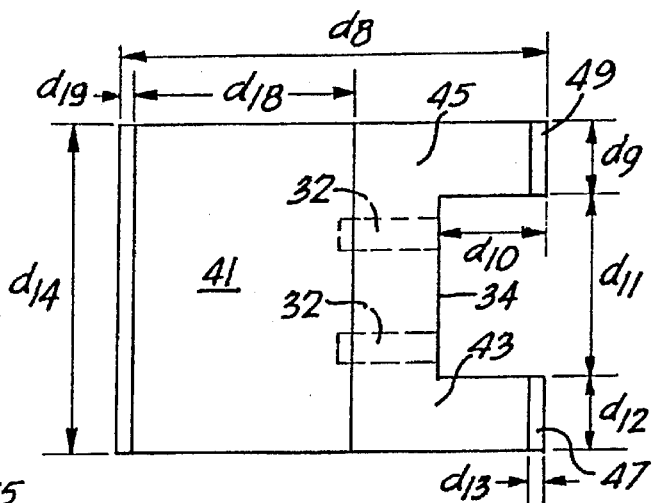
FIG. 6 is a top view of the prior art clip head of FIG. 5.

In FIGS. 1 and 2, prior art clips for retaining semiconductor wafers are shown, as shown and described in FIGS. 6 and 4 of DiNapoli et al. U.S. Pat. No. 5,183,245, respectively (hereinafter referred to as DiNapoli). The teachings of DiNapoli are incorporated herein by reference, but any discrepancies between the teachings of the present disclosure and those of DiNapoli are to be held in favor of the present description. In FIG. 1, a semiconductor wafer retention clip 1 of the prior art includes a securement or clip head 3 including a forwardmost flat top section 5 that terminates in a forwardly extending but downwardly sloping linear front edge section 7. The narrow slopping edge section 7 shares a common leading edge with a lower downward and rearward sloping narrow edge section 9. The edge section 9 terminates along a bottom edge to a narrow bottom section 11, which in turn terminates to a vertically oriented front wall of the clip head 3 to which a flexible flat metal spring 13 is secured via two metal screws 15, as shown. The other end of the spring 13 is sandwiched between a mounting member 17 and the back surface of a mounting column 19, which are secured together by means of screws (not shown), for example (see FIG. 5 of DiNapoli). The bottom of the mounting column 19 terminates into a base portion 21 having a left hand mounting flange 23 and a right hand mounting flange 25. Holes 27 and 29 are provided through mounting flanges 23 and 25, respectively, for permitting the semiconductor wafer retention clip 1 to be rigidly mounted by appropriate screws or bolts about the circumference of a semiconductor wafer supporting pedestal, as taught in DiNapoli. The back or rear portion of the clip head 3 is provided with a depression tab 31 that is adapted for engagement with a tool for pushing the tab downward to overcome the spring bias provided by spring 13, causing the clip head to move in an arc-like manner away from contact with an associated semiconductor wafer on a pedestal, that is for either permitting installation of a semiconductor wafer on an associated pedestal or removal of a semiconductor wafer therefrom. The mounting column 19, as shown, includes two posts 33 and 35 separated by a recess 37 at the topmost portion of the mounting column 19.

With reference to FIG. 2, DiNapoli improved the semiconductor wafer retention clip 1 in providing the modified design 39 shown. The modified clip design 39 includes a clip head 41 that differs from the clip head 3 of FIG. 1, in having a notch like open area 43 for providing a pair of tines 44 and 45, each having a forwardly extending linear edge 47 and 49, respectively, that is narrower than the forwardly extending leading edge 7 of the clip 1 (more complete details of the modified clip 39 are given in DiNapoli).

Figure 3:
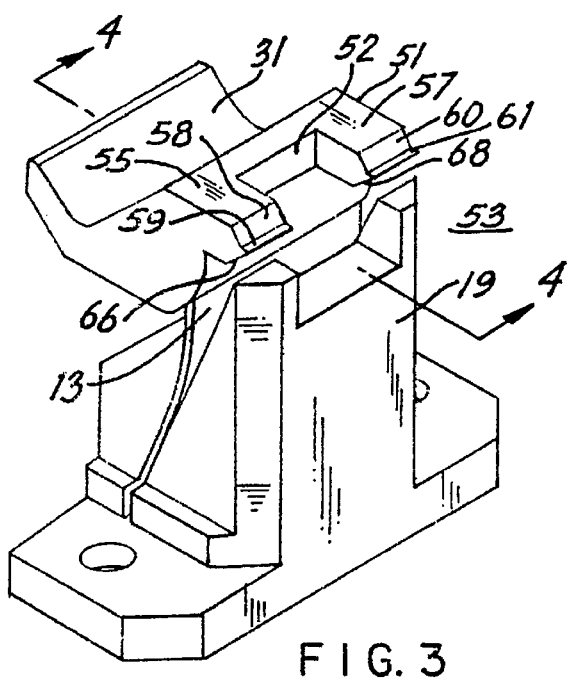
FIG. 3 is a prospective view of one embodiment of the invention for a clip head for retaining semiconductor wafers on a pedestal.

The present inventors, in recognizing the persistent problem of high voltage arc over from the plasma to the metal portions of the clip head, particularly the mounting screws 15 for the metal spring 13, and the problem of plastic material or particulates from the clip head 41 falling onto the surface of the associated semiconductor wafer, in one embodiment designed a new clip head 51 for a semiconductor wafer retention clip 53 as shown in FIG. 3, to reduce these problems. In comparison to the prior clip head 41 of FIG. 2, in this embodiment of the invention, the new clip head 51 includes tines 55 and 57 that are configured differently than the tines 44 and 45, respectively, of clip head 41. As shown, tines 55 and 57 each include a forwardly projecting shelf or ledge 59, 61, respectively. The shelves 59 and 61 serve the purpose of catching or retaining debris resulting from decomposition of the material of clip head 51, thereby substantially reducing the amount of debris or particulate material that might otherwise fall onto the surface of the associated semiconductor wafer during processing thereof. This function of the shelves 59 and 61 is more apparent from FIG. 4, showing a cross sectional view of clip head 51 (taken along 4—4 of FIG. 3) with a frontwardly extending sloping lower face 66 spring biased against a top circumferential edge of a semiconductor wafer 65 positioned on a mounting head 67 on top of a pedestal 69. Note, as shown in FIG. 4, that the clip head 51, in being spring biased by spring 13 against the semiconductor wafer 63, is as a result slightly tilted relative to the horizontal plane of the semiconductor wafer 63, whereby the shelf 59 is at an angle tilting upward away from the surface of the semiconductor wafer 63. In this manner, the junction between the forwardly extending downwardly sloping front face 58 of tine 55 and ledge 59 serves as a trough 62 for trapping debris in a positive manner. Note that it is preferred that the front face 58 be sloped, but in some applications it may be at 90° with ledge 59, or even rearwardly sloped from the top to ledge 59. Other differences between the prior clip head 41 and the present clip head 51 of one embodiment of the invention are discussed in greater detail below.

In another embodiment of the invention, as shown in FIGS. 3 and 4, the retention spring 13 is molded into the clip head 51, in a manner causing the upper portion of spring 13 to be surrounded by and embedded within the material of clip head 51. Typically, the material of the clip head is electrically insulative, thereby providing for another embodiment of the invention, electrical isolation of spring 13 from the plasma. In another embodiment of the invention, spring 13 is stainless steel, for example, and is appropriately positioned in a mold cavity for injection molding clip head 51, in this example. Appropriate dielectric material, such as molten polycarbonate for example, is injected into the mold cavity under high pressure, for molding clip head 51 with spring 13. In this manner, the spring 13 is strongly secured in a monolithic assembly with clip head 51. The resultant assembly is very strong.

Figure 7:
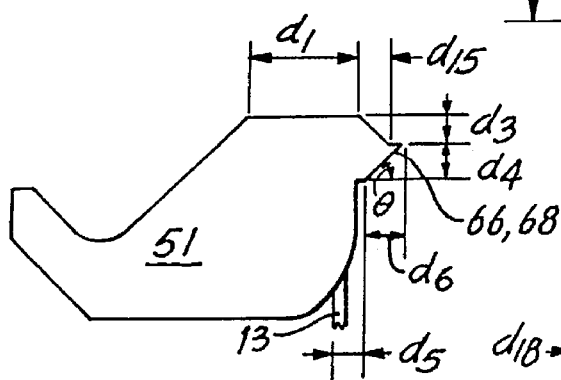
FIG. 7 is a side elevational view of the clip head of FIG. 3 of one embodiment of the invention.
Figure 8:
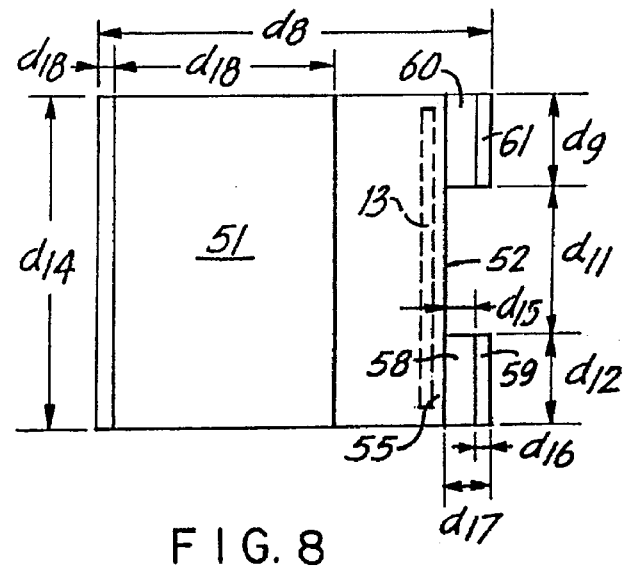
FIG. 8 is a top view of the clip head of FIG. 7.

FIG. 5 shows a side elevational view of the prior clip head 41 shown in perspective in FIG. 2. FIG. 6 is a top view of the prior art clip head 41. In comparison, FIG. 7 shows a side elevational view of one side of the present assembly of clip head 51 and spring 13, the other side being a mirror image thereof. FIG. 8 is a top view of the present assembly of clip head 51 and spring 13. Typical dimensions for the prior clip head 41, and present clip head 51, are shown in Table 1 below in fractions of an inch. These dimensions are shown as "$d_1$" through "$d_{19}$". A comparison of the dimensioning between corresponding surfaces between the clip heads 41 and 51 more specifically illustrates some of the design differences therebetween.

TABLE 1

| REFERENCE DIMENSION (INCH) | CLIP READ 41 | CLIP MM 51 |
| --- | --- | --- |
| d1 | .234 | .149 |
| d2 | .021 | — |
| d3 | .021 | .041 |
| d4 | .07 | .050 |
| d5 | .07 | .045 |
| d6 | .07 | .050 |
| d7 | .125 | .125 |
| d8 | .570 | .525 |
| d9 | .125 | .127 |
| d10 | .140 | .095 |
| d11 | .250 | .200 |
| d12 | .125 | .127 |
| d13 | .021 | — |
| d14 | .454 | .454 |
| d15 | — | .041 |
| d16 | — | .020 |
| d17 | — | .061 |
| d18 | .295 | .295 |
| d19 | .020 | .020 |

From Table 1, it is clear that the present clip head 51 is shorter than the prior clip head 41. The depression tab 31 provided on the clip heads 41 and 51 are substantially identical, as illustrated by the dimensioning for $d_{18}$ and $d_{19}$. Also, the widths of the clip heads 41 and 51, as illustrated by $d_{14}$, are substantially identical. However, the frontmost portions of the clip heads 41 and 51 are substantially different both in design configuration, and dimensionally, as shown in the figures and Table 1.

Also, as taught in DiNapoli, the prior clip head 41 is configured with its tines "separated from one another by a space equal to at least twice the width of one of the tines" (column 3, lines 13–16, of DiNapoli U.S. Pat. No. 5,183, 245). Contrary to this, for the present clip head 51, the tines are separated from one another by a space $d_{11}$ that is less than twice the width of each of the tines 55 and 57, in this example.

The lower frontwardly extending surfaces 63 and 64 of tines 44, 45, respectively, of the prior clip head 41, are at an angle of θ of about 45°. Similarly, the semiconductor wafer contacting surfaces 66 and 68 of tines 55, 57, respectively, of clip head 51, are also at an angle θ of about 45°, as shown in FIG. 7 for the present clip head 51. Otherwise, the dimensioning and design configuration of the front portions of the prior clip head 41 and present clip head 51 of one embodiment of the invention are substantially different. However, in this one embodiment of the invention, the other portions exclusive of the clip head 51 of the present semiconductor wafer retention clip 53 are substantially the same as those of the other features of the prior semiconductor wafer retention clip 39. Such other features include the mounting column 19, base 21, flanges 23 and 25, posts 33 and 35, metal leaf spring 13, mounting member 17, and screws 15. With regard to screws 15, note in FIGS. 5–8, the holes 32 for receiving the screws 15, in this example. The holes are formed in the front face of prior clip head 41, and front face of clip head 51.

In another embodiment of the invention, the present inventors recognized that the metal screws 15 used in the prior clips 1 and 39 of FIGS. 1 and 2, respectively, and in one embodiment of the present clip 53 shown in FIG. 3, are one cause of the voltage arcing problem. This arcing problem is increased due to the increased exposure of the screws 15 caused by the open area 43 provided in the prior clip head 41, and the open area 52 provided in the clip head 51, relative to prior clip head 3 which does not have such open areas. To substantially reduce this voltage arcing problem, the present inventors conceived the idea of molding clip heads 3 and/or 41 about spring 13, as described above for clip head 51. These embodiments of the invention provide substantially improved clip head assemblies for clip heads 3, 41, and 51, respectively.

Figure 9:
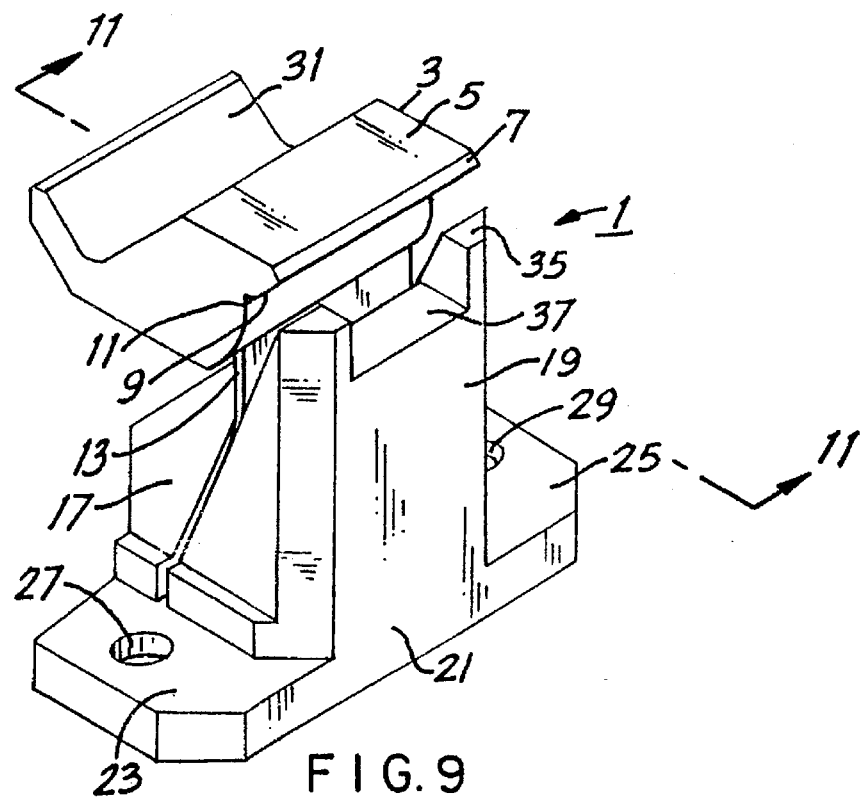
FIG. 9 is a perspective view of another embodiment of the invention.
Figure 10:
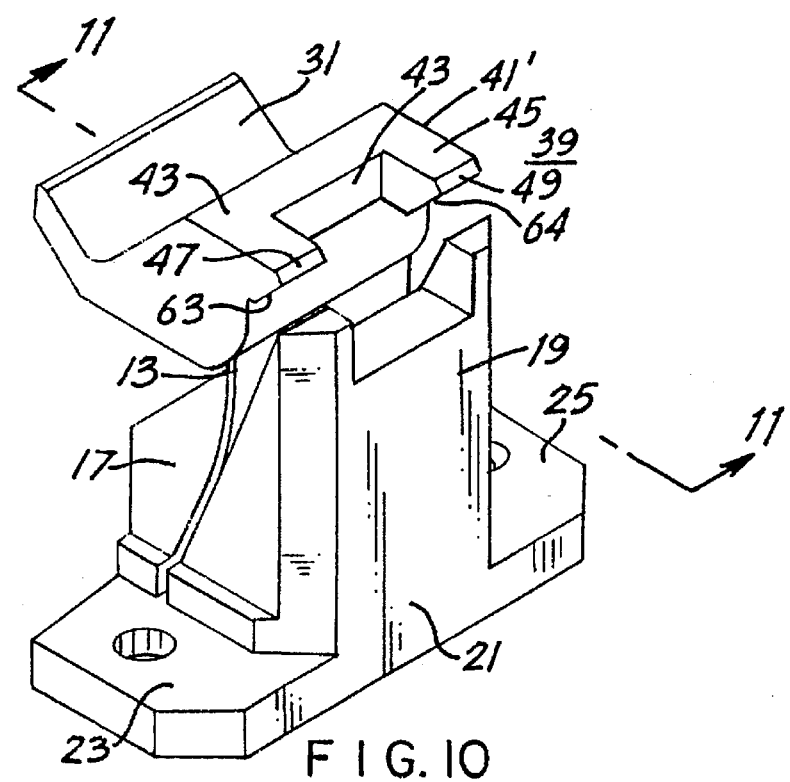
FIG. 10 is a perspective view of another embodiment of the invention.
Figure 11:
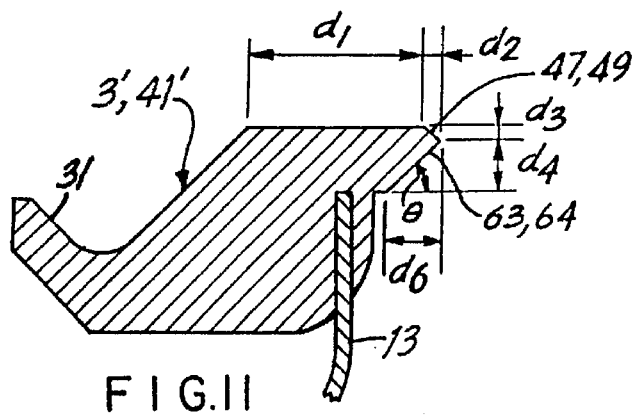
FIG. 11 is a cross-sectional view taken along 11—11 of the clip head of FIG. 9, and/or the clip head of FIG. 10, of two embodiments of the invention, respectively.

FIG. 9 shows a pictorial drawing of the embodiment of the invention for providing an improved clip head 3' and spring 13 assembly relative to clip head 3 (see FIG. 1). FIG. 10 shows a pictorial drawing of the embodiment of the invention for providing an improved clip head 41' and spring 13 assembly relative to clip head 41 (see FIG. 2). As previously described, the combination of a spring 13 with each of clip heads 3 and 41, form monolithic clip head assemblies 3' and 41'. FIG. 11 shows a partial cross sectional view of clip head assemblies 3' and 41', respectively, taken along 11—11 of FIGS. 9 and 10, respectively.

Figure 13:
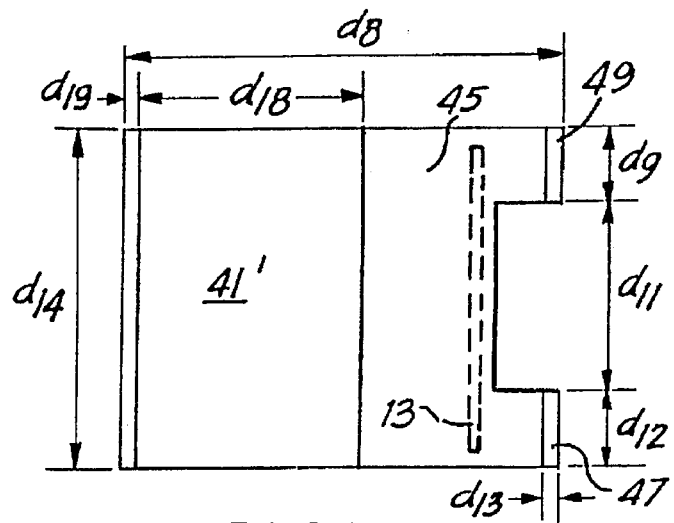
FIG. 13 is a top view of the clip head of FIG. 10.
Figure 12:
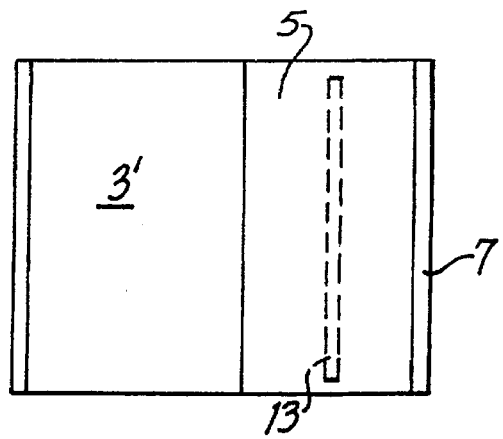
FIG. 12 is a top view of the clip head of FIG. 9.

FIG. 12 shows a top view of monolithic clip head 3' with spring 13. FIG. 13 shows a top view of monolithic clip head 41' with spring 13.

With further reference to FIG. 5, and to Table 1, and as taught in DiNapoli, for the prior clip head 41 the front-to-rear sloping surfaces 63, 64 of tines 44 and 45, respectively, have widths $d_6$ that are at least several times greater than the widths $d_2$ of the upper front-to-rear sloping surfaces 47, 49, respectively. Also, it is taught that the leading edge portions of the tines 44 and 45 are elevationally at least several times closer to the uppermost top side surfaces of the tines 44, 45 than to the lower most bottom side surfaces thereof.

The present clip head 51, with further reference to FIGS. 7 and 8, and Table 1, has a substantially different design, as previously mentioned. For example, the widths $d_6$ of the lower sloping surfaces 66, 68, of tines 55, 57, respectively, are almost equal to the widths $d_{15}$ of their associated upper front-to-rear sloping surfaces 58, 60, respectively. Also, in the prior clip head 41 of FIGS. 5 and 6, the leading edge of tines 44 and 45 is formed from the junction between the upper sloping surfaces 47, 49, respectively, with the lower sloping surfaces 63, 64, respectively. Contrary to this, in the present clip head 51 the leading edges of tines 55 and 57 are formed via the junction between the shelves or ledges 59, 61, respectively, with the lower sloping surfaces 66, 68, respectively. Also, the leading edges of the tines 55 and 57 are elevationally only slightly closer to the uppermost top surfaces of the tines 55, 57, respectively, than to the lower most bottom side surfaces thereof, respectively. Also, as previously mentioned, for prior clip head 41 the spacing $d_{11}$ between tines 44 and 45 is at least twice the side-to-side widths $d_{12}$, $d_9$, respectively, of one of the tines, whereas in the present clip head 51 the comparable spacing between the tines 55 and 57 is less than the side-to-side width of either one of the tines 55 or 57. In the present clip head 51, relative to the prior clip head 41, the wider tines 55, 57 relative to the tines 44, 45 of the prior design, respectively, the shortened length of the present tines 55, 57 relative to the prior tines 44, 45, respectively, and the reduced spacing $d_{11}$ between the present tines 55 and 57, relative to the prior tines 44 and 45, respectively, in combination with molding spring 13 into clip head 51, as previously described, substantially eliminates voltage arcing problems.

Although various embodiments of the invention have been shown and described herein, they are not meant to be limiting. Those of skill in the art may recognize certain modifications to these embodiments, which modifications are meant to be covered by the spirit and scope of the appended claims.

What is claimed is:

1. A retention clip apparatus for removably securing a semiconductor wafer on a pedestal, said clip apparatus comprising:

a clip head including:

a rearmost depression tab;

at least a first tine at a frontmost portion of said clip head, said first tine including a lower front face downwardly sloping from a front leading edge toward said depression tab, said lower front face providing a surface for contacting an associated semiconductor wafer, an upper front face downwardly sloping from a top surface toward said front leading edge and joined thereto;

a lower front face above which said first tine projects away from and outward;

a base member; and spring bias means having a portion of one end monolithically molded into material of said clip head proximate said lower front face thereof, and another end secured to said base member, for biasing said clip head toward an associated said semiconductor wafer.

2. The retention clip apparatus of claim 1, wherein said clip head further includes:

a second tine parallel to and spaced apart from said first tine, said second tine including a lower front face downwardly sloping from a front leading edge toward said depression tab, said lower front face providing a surface for contacting an associated semiconductor wafer, an upper front face downwardly sloping from a top surface toward said front leading edge and joined thereto.

3. The retention clip apparatus of claim 1, wherein said clips head further includes:

said first tine further including an intermediate top surface means for both joining a lower edge of said upper front face to said front leading edge, and catching debris or particulate matter to substantially prevent its falling from said first tine onto the surface of an associated said semiconductor wafer.

4. The retention clip apparatus of claim 2, wherein said clip head further includes:

said first and second tines each further including an intermediate top surface means for both joining a lower edge of said upper front face to said front leading edge, and catching debris or particulate matter to substantially prevent its falling from the associated said first or second tine onto the surface of an associated said semiconductor wafer.

5. The retention clip apparatus of claim 4, wherein for each of said first and second tines, said intermediate top surface means includes a rectangularly shaped surface.

6. The retainer slip apparatus of claim 5, wherein for each of said first and second tines, said rectangularly shaped surface is flat.

7. The retention clip apparatus of claim 5, wherein for each of said first and second tines, said rectangularly shaped intermediate top surface is parallel to horizontal planes of top and bottom surfaces of said tines.

8. The retention clip apparatus of claim 1, wherein said clip head consists of electrically nonconductive material.

9. The retention clip apparatus of claim 8, where said clip head consists of a single piece of plastic material.

10. A clip head for use in retention clip apparatus for removably securing a semiconductor wafer on a pedestal, said clip head including a rearmost depression tab for receiving a tool, frontmost first and second tines spaced apart from one another and projecting away from a front face of said clip head, respectively, wherein the improvement comprises:

each one of said first and second tines including:

an intermediate surface providing a ledge or shelf terminating at a leading forwardmost edge of the respective tine, for trapping debris or particulate matter that might otherwise fall onto the surface of an associated semiconductor wafer;

an upper front face between a top surface thereof and an interior edge of said intermediate surface;

a lower front face sloping downwardly from the front-to-rear of said clip head between the leading edge of the associated tine and a bottom surface of the associated tine; and spring bias means having a portion of one end monolithically molded into material of a bottom portion of said clip head proximate said first and second tines.

11. The clip head of claim 10, wherein said upper front face slopes downwardly from the rear-to-front of said clip.

12. The clip head of claim 10, wherein said intermediate surface is flat.

13. The clip head of claim 10, wherein said intermediate surface of each of said first and second tines is in a plane parallel to the horizontal planes of top and bottom surfaces of its associated tine.

14. The clip head of claim 10, wherein the space between said first and second tines is less than twice the side-to-side width of one of the tines.

15. The clip head of claim 10, wherein the leading edges of said first and second tines are slightly closer to the top than the bottoms of the associated tines.

16. The clip head of claim 10, wherein said first and second tines each have a rear-to-front width of the associated said upper front face slightly smaller than the front-to-rear width of the associated said lower front face.

17. The clip head of claim 10, wherein said first and second tines, and said depression tab are formed from a single piece of plastic material.

* * * * *